United States Patent
Woo et al.

(10) Patent No.: US 9,458,550 B2
(45) Date of Patent: *Oct. 4, 2016

(54) SYSTEMS AND METHODS FOR SEPARATING COMPONENTS OF A MULTILAYER STACK OF ELECTRONIC COMPONENTS

(71) Applicant: The Boeing Company, Seal Beach, CA (US)

(72) Inventors: Robyn L. Woo, El Monte, CA (US); Xiaobo Zhang, Arcadia, CA (US); Christopher M. Fetzer, Valencia, CA (US); Eric M. Rehder, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 100 days.

This patent is subject to a terminal disclaimer.

(21) Appl. No.: 14/263,027

(22) Filed: Apr. 28, 2014

(65) Prior Publication Data

US 2014/0238872 A1  Aug. 28, 2014

Related U.S. Application Data

(63) Continuation of application No. 13/777,334, filed on Feb. 26, 2013, now Pat. No. 8,748,324.

(51) Int. Cl.
*H01L 21/78* (2006.01)
*H01L 21/77* (2006.01)
(Continued)

(52) U.S. Cl.
CPC .............. *C25F 5/00* (2013.01); *H01L 21/77* (2013.01); *H01L 21/7806* (2013.01); *H01L 21/7813* (2013.01); *H01L 31/06875* (2013.01); *H01L 31/1892* (2013.01); *Y02E 10/544* (2013.01)

(58) Field of Classification Search
CPC ............ H01L 21/3063; H01L 21/465; H01L 21/7806; H01L 21/7813; H01L 21/64; H01L 21/77; C25F 3/14

See application file for complete search history.

(56) References Cited

U.S. PATENT DOCUMENTS

| 4,846,931 A | 7/1989 | Gmitter et al. |
|---|---|---|
| 4,883,561 A | 11/1989 | Gmitter et al. |

(Continued)

OTHER PUBLICATIONS

Tamboli et al, "Photoelectrochemical roughening of p-GaN for light extraction from GaN/InGaN light emitting diodes," Physica Status Solidi C, vol. 6, No. S2, S807-S810, (2009).

(Continued)

*Primary Examiner* — Evan Pert
(74) *Attorney, Agent, or Firm* — D'Ascenzo Intellectual Property Law, P.C.

(57) ABSTRACT

Systems and methods for separating components of a multilayer stack of electronic components are disclosed herein. The multilayer stack may include an electronic assembly, a substrate, and a sacrificial anode portion that is located between the electronic assembly and the substrate and that operatively attaches the electronic assembly to the substrate. The methods may include locating the multilayer stack within an electrically conductive fluid to form an electrochemical cell and generating a potential difference between a cathode portion of the electronic assembly and the sacrificial anode portion. The methods further may include separating the electronic assembly from the substrate by electrochemically oxidizing the sacrificial anode portion to dissolve the sacrificial anode portion within the electrically conductive solution.

22 Claims, 4 Drawing Sheets

(51) Int. Cl.
*C25F 5/00* (2006.01)
*H01L 31/18* (2006.01)
*H01L 31/0687* (2012.01)

(56) References Cited

U.S. PATENT DOCUMENTS

| | | | |
|---|---|---|---|
| 5,344,517 A * | 9/1994 | Houlding | C25F 3/12 156/236 |
| 5,641,381 A | 6/1997 | Bailey et al. | |
| 6,884,740 B2 | 4/2005 | Hu et al. | |
| 7,994,419 B2 | 8/2011 | Pan et al. | |
| 8,748,324 B1 * | 6/2014 | Woo | C25F 5/00 204/242 |
| 2003/0045120 A1 | 3/2003 | Hu et al. | |
| 2009/0044860 A1 | 2/2009 | Pan et al. | |
| 2009/0283800 A1 | 11/2009 | Im et al. | |
| 2010/0116784 A1 | 5/2010 | Archer | |
| 2010/0317132 A1 | 12/2010 | Rogers et al. | |

OTHER PUBLICATIONS

Konagai et al., "High Efficiency GaAs Thin Film Solar Cells by Peeled Film Technology," Journal of Crystal Growth 45, 277-280, 1978.

Yablanovitch et al., "Extreme Selectivity in the Liftoff of Epitaxial GaAs Films," Appl. Phys. Lett. 51, 2222-2224, 1987.

Yablonovitch et al., "Van der Waals Bonding of GaAs Epitaxial Liftoff Films Onto Arbitrary Substrates," Appl. Phys. Lett. 56, 2419-2421, 1990.

Lee et al., "Multiple Growths of Epitaxial Lift-Off Solar Cells from a Single InP Substrate," Appl. Phys. Lett. 97, 101107, 2010.

Yoon et al., "GaAs Photovoltaics and Optoelectronics Using Releasable Multilayer Epitaxial Assemblies," Nature Lett. 465, 329-333, May 20, 2010.

* cited by examiner

SYSTEMS AND METHODS FOR SEPARATING COMPONENTS OF A MULTILAYER STACK OF ELECTRONIC COMPONENTS

RELATED APPLICATION

The present application is a continuation of, and claims priority to, U.S. patent application Ser. No. 13/777,334, filed on Feb. 26, 2013 and entitled "SYSTEMS AND METHODS FOR SEPARATING COMPONENTS OF A MULTILAYER STACK OF ELECTRONIC COMPONENTS," the complete disclosure of which is hereby incorporated by reference.

FIELD

The present disclosure is directed generally to systems and methods for separating components of a multilayer stack of electronic components, and more specifically to systems and methods that include electrochemical oxidation of a sacrificial anode to dissolve the sacrificial anode to permit separation of the components of the multilayer stack.

BACKGROUND

Electronic and/or optoelectronic devices may be fabricated on a substrate; and, under certain conditions, it may be desirable to separate the devices from the substrate. As an illustrative, non-exclusive example, it may be desirable to decrease an overall thickness and/or weight of the devices through removal of the substrate. As another illustrative, non-exclusive example, certain photovoltaic cells may be fabricated in such a manner that at least a portion of the substrate must be separated from the photovoltaic cells prior to operation thereof. This may be especially true with inverted photovoltaic cells, which may be designed to receive light from a side of the inverted photovoltaic cell that is in contact with the substrate during fabrication of the inverted photovoltaic cell. Under these conditions, separation of the photovoltaic cells from the substrate may permit additional light to contact the photovoltaic cell, thereby enabling operation and/or increasing an operational efficiency of the photovoltaic cell.

Historically, etching operations have been utilized to separate the devices from the substrate. These etching operations may utilize highly corrosive chemical solutions and rely upon a difference in etch rate, or etch selectivity, between two or more components to selectively separate the devices from the substrate. While such an approach may be effective at removing the devices from the substrate, it may be difficult to fabricate the devices with a desired degree of etch selectivity. Additionally or alternatively, a rate at which the separation occurs may be prohibitively slow, increasing an overall time needed to fabricate the devices and separate them from the substrate. Thus, there exists a need for improved systems and methods for separating components of a multilayer stack of electronic components.

SUMMARY

Systems and methods for separating components of a multilayer stack of electronic components are disclosed herein. The multilayer stack may include an electronic assembly, a substrate, and a sacrificial anode portion that is located between the electronic assembly and the substrate and that operatively attaches the electronic assembly to the substrate. The sacrificial anode portion may be configured to be dissolved via electrochemical oxidation to permit separation of the electronic assembly from the substrate.

In some embodiments, the electronic assembly may include a sacrificial photovoltaic cell that is configured to apply an electric potential to the sacrificial anode portion to power dissolution of the sacrificial anode portion. In some embodiments, the electronic assembly further includes a cathode portion. In some embodiments, the sacrificial photovoltaic cell is configured to generate a potential difference between the cathode portion and the sacrificial anode portion to power dissolution of the sacrificial anode portion. In some embodiments, the sacrificial photovoltaic cell is located between the substrate and a device portion of the electronic assembly.

In some embodiments, the multilayer stack is located within an electrically conductive fluid to form an electrochemical cell. In some embodiments, a fraction of the sacrificial anode portion is dissolved within the electrically conductive fluid. In some embodiments, a power source is in electrical communication with a cathode portion of the multilayer stack and with the sacrificial anode portion and is configured to generate the potential difference therebetween. In some embodiments, the power source forms a portion of the multilayer stack. In some embodiments, the power source is external to the multilayer stack.

The methods may include locating the multilayer stack within an electrically conductive fluid to form an electrochemical cell and generating a potential difference between a cathode portion of the electronic assembly and the sacrificial anode portion. The methods further may include separating the electronic assembly from the substrate by electrochemically oxidizing the sacrificial anode portion to dissolve the sacrificial anode portion within the electrically conductive fluid.

In some embodiments, the methods may include generating the potential difference between the cathode portion and the sacrificial anode portion with a sacrificial photovoltaic cell. In some embodiments, the methods further may include directing electromagnetic radiation onto the sacrificial photovoltaic cell to initiate the generating. In some embodiments, the methods may include generating the potential difference between the cathode portion and the sacrificial anode portion with an external power source.

In some embodiments, the separating may include separating without etching the sacrificial anode portion and/or without mechanically peeling the electronic assembly from the substrate. In some embodiments, the electronic assembly may include a plurality of electronic devices and the methods further may include singulating the plurality of electronic devices concurrently with the separating.

DESCRIPTION

Figure 1:
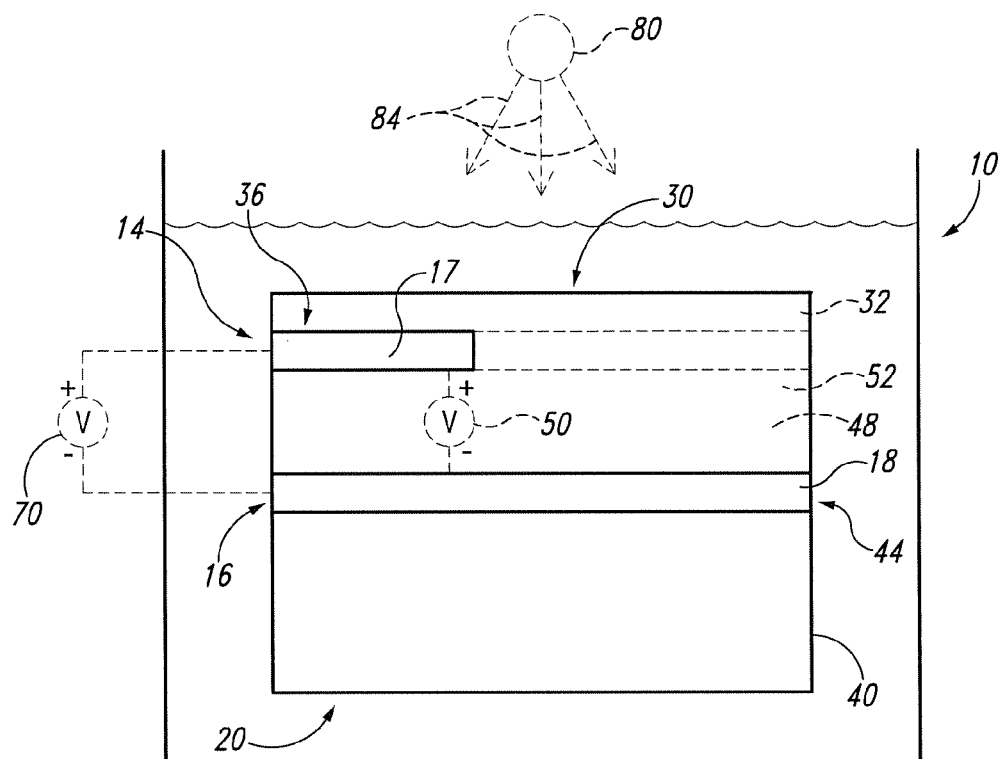
FIG. 1 is a schematic representation of illustrative, non-exclusive examples of an electrochemical cell that includes a multilayer stack that includes an electronic assembly, a substrate, and a sacrificial anode portion according to the present disclosure.

FIGS. 1-6 provide illustrative, non-exclusive examples of electrochemical cells 10, multilayer stacks 20, and/or components thereof according to the present disclosure. Elements that serve a similar, or at least substantially similar, purpose are labeled with like numbers in each of FIGS. 1-6, and these elements may not be discussed in detail herein with reference to each of FIGS. 1-6. Similarly, all elements may not be labeled in each of FIGS. 1-6, but reference numerals associated therewith still may be utilized herein for consistency. In general, elements that are likely to be included in a given embodiment are shown in solid lines, while elements that are optional to a given embodiment are shown in dashed lines. However, elements that are shown in solid lines are not essential to all embodiments, and an element shown in solid lines may be omitted from a particular embodiment without departing from the scope of the present disclosure.

FIG. 1 is a schematic representation of illustrative, non-exclusive examples of a multilayer stack 20 according to the present disclosure that may be present in and/or form a portion of an electrochemical cell 10. Multilayer stack 20 of FIG. 1 includes at least an electronic assembly 30, a substrate 40, and a sacrificial anode portion 44. Electronic assembly 30 includes a device portion 32 and a cathode portion 36. In addition, and as illustrated in dashed lines in FIG. 1, electronic assembly 30 also may include a sacrificial photovoltaic cell 48 and/or an etch stop layer 52.

As illustrated in FIG. 1, multilayer stack 20 may be located, at least partially immersed, and/or at least partially submerged within an electrically conductive fluid 12 to form electrochemical cell 10. Under these conditions, cathode portion 36 of electronic assembly 30 and electrically conductive fluid 12 together may form a first half-cell 14 of electrochemical cell 10, with cathode portion 36 functioning as a cathode 17 of the electrochemical cell. Similarly, sacrificial anode portion 44 of multilayer stack 20 and electrically conductive fluid 12 together may form a second half-cell 16 of electrochemical cell 10, with sacrificial anode portion 44 functioning as an anode 18 of the electrochemical cell.

Figure 2:
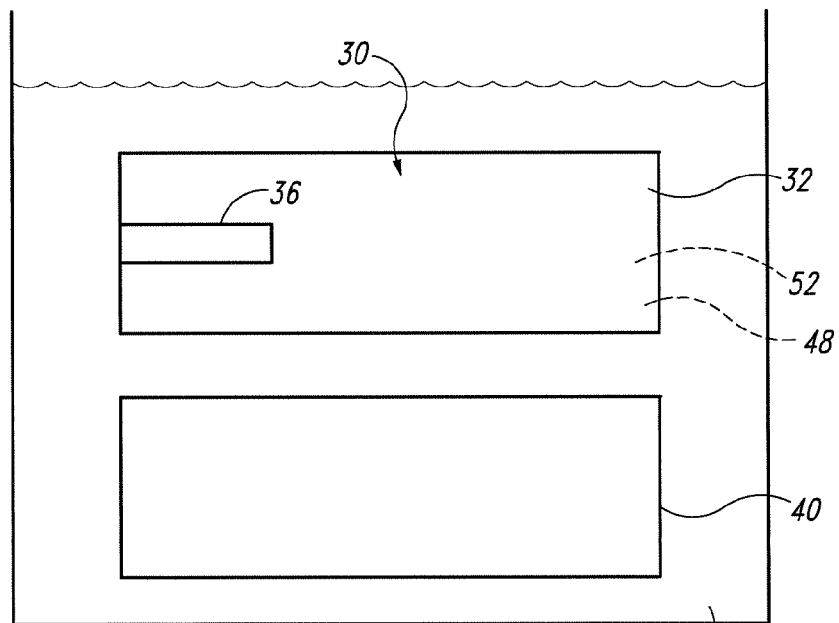
FIG. 2 is a schematic representation of illustrative, non-exclusive examples of the electronic assembly of FIG. 1 after being electrochemically separated from the substrate through dissolution of the sacrificial anode portion.

The systems and methods according to the present disclosure may include separating electronic assembly 30 from substrate 40 by dissolving sacrificial anode portion 44 within electrically conductive fluid 12. This may include electrochemically oxidizing sacrificial anode portion 44 to produce the dissolution thereof, and is illustrated in FIG. 2. Therein, sacrificial anode portion 44 has been dissolved within electrically conductive fluid 12, permitting separation of electronic assembly 30 (and components thereof) from substrate 40.

As discussed in more detail herein, it is within the scope of the present disclosure that, subsequent to separation of electronic assembly 30 from substrate 40, one or more additional components of electronic assembly 30 may be separated and/or removed therefrom. As illustrative, non-exclusive examples, cathode portion 36, sacrificial photovoltaic cell 48, and/or etch stop layer 52 may be separated and/or removed from the electronic assembly, thereby separating device portion 32 from a remainder of electronic assembly 30. This may permit utilization of device portion 32 independent from the other components of multilayer stack 20 and/or electronic assembly 30.

In addition, and as also discussed in more detail herein, it is further within the scope of the present disclosure that substrate 40 may be reused and/or recycled subsequent to separation from electronic assembly 30. This may include formation of a subsequent electronic assembly 30 on substrate 40 and later removal of the subsequent electronic assembly 30 from substrate 40 in a manner that may be similar to that discussed above.

Returning to FIG. 1, it is within the scope of the present disclosure that the electrochemical oxidation of sacrificial anode portion 44 may be powered in any suitable manner. As an illustrative, non-exclusive example, and when electronic assembly 30 includes sacrificial photovoltaic cell 48, the systems and methods may include, and/or sacrificial photovoltaic cell 48 may be in optical communication with, a source 80 of electromagnetic radiation 84 that is oriented to direct electromagnetic radiation 84 onto sacrificial photovoltaic cell 48. Under these conditions, a wavelength and/or intensity of electromagnetic radiation 84 may be selected such that sacrificial photovoltaic cell 48 functions as an internal power source 50 and generates a potential difference between cathode 17 and anode 18 of electrochemical cell 10 that is sufficient to produce the electrochemical oxidation of sacrificial anode portion 44, thereby dissolving sacrificial anode portion 44 within electrically conductive fluid 12.

Additionally or alternatively, and as another illustrative, non-exclusive example, electrochemical cell 10 may include and/or be in electrical communication with an external power source 70. Under these conditions, external power source 70 may generate the potential difference between cathode 17 and anode 18 of electrochemical cell 10 that is sufficient to produce the electrochemical oxidation of sacrificial anode portion 44, thereby dissolving sacrificial anode portion 44 within electrically conductive fluid 12.

Figure 3:
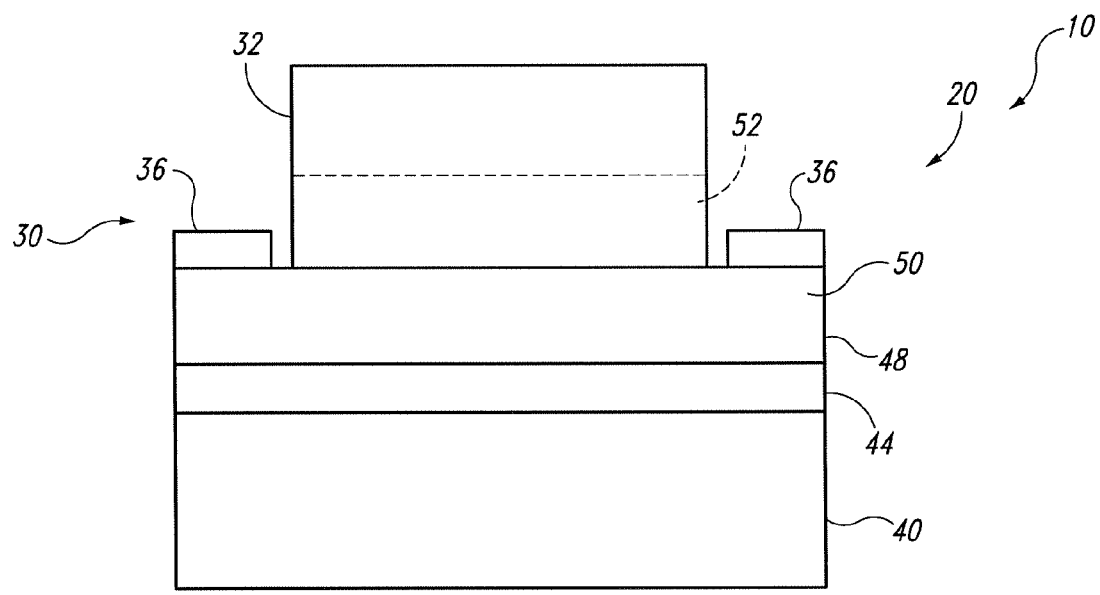
FIG. 3 provides less schematic but still illustrative, non-exclusive examples of a cross-sectional view of a multilayer stack according to the present disclosure that includes an electronic assembly, a substrate, and a sacrificial anode portion.

FIG. 3 provides less schematic but still illustrative, non-exclusive examples of a cross-sectional view of a multilayer stack 20 according to the present disclosure that includes an electronic assembly 30, a substrate 40, and a sacrificial anode portion 44. In multilayer stack 20 of FIG. 3, sacrificial anode portion 44 operatively attaches electronic assembly 30 to substrate 40. Multilayer stack 20 of FIG. 3 may be a more detailed illustration of multilayer stack 20 of FIGS. 1-2 and may form a portion of any suitable electrochemical cell 10, as illustrated in FIG. 1.

As illustrated in FIG. 3, electronic assembly 30 includes a sacrificial photovoltaic cell 48, one or more cathode portions 36, and a device portion 32. In addition, and as illustrated in dashed lines in FIG. 3, electronic assembly 30 also may include an etch stop layer 52.

Sacrificial anode portion 44 may be located between sacrificial photovoltaic cell 48 and substrate 40 and may operatively attach sacrificial photovoltaic cell 48 to substrate 40. In addition, sacrificial photovoltaic cell 48 may be in electrical communication with both sacrificial anode portion 44 and cathode portions 36 and may electrically separate sacrificial anode portion 44 from cathode portions 36. Thus, and as discussed in more detail herein with reference to FIGS. 1-2, when light is incident upon sacrificial photovoltaic cell 48, sacrificial photovoltaic cell 48 may function as and/or be an internal power source 50 for electronic assembly 30 and/or multilayer stack 20 and may generate a potential difference between sacrificial anode portion 44 and cathode portions 36.

Device portion 32 may be directly or indirectly operatively attached to and/or engaged with sacrificial photovoltaic cell 48, with sacrificial photovoltaic cell 48 being located between device portion 32 and sacrificial anode portion 44. Thus, sacrificial anode portion 44 is located between substrate 40 and device portion 32 and operatively attaches device portion 32 to substrate 40. Conversely, dissolution of sacrificial anode portion 44 separates both device portion 32 and sacrificial photovoltaic cell 48 from substrate 40, as illustrated in FIG. 4.

Returning to FIG. 3, optional etch stop layer 52 may be located between sacrificial photovoltaic cell 48 and device portion 32 and/or may electrically isolate sacrificial photovoltaic cell 48 from device portion 32. In addition, etch stop layer 52 may be directly or indirectly operatively attached to and/or engaged with sacrificial photovoltaic cell 48 and/or device portion 32. Thus, sacrificial anode portion 44 is located between substrate 40 and etch stop layer 52 and operatively attaches etch stop layer 52 to substrate 40. Conversely, dissolution of sacrificial anode 44 separates etch stop layer 52 from substrate 40, as illustrated in FIG. 4.

Figure 4:
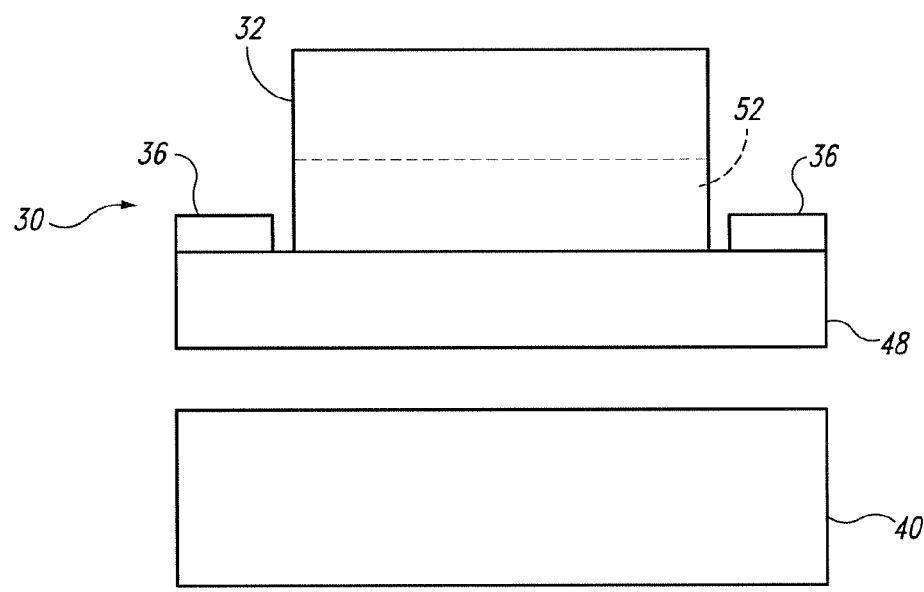
FIG. 4 provides less schematic but still illustrative, non-exclusive examples of a cross-sectional view of the electronic assembly of FIG. 3 after being electrochemically separated from the substrate through dissolution of the sacrificial anode portion.

FIG. 4 provides less schematic but still illustrative, non-exclusive examples of a cross-sectional view of electronic assembly 30 of FIG. 3 separated from substrate 40, such as may be accomplished through electrochemical dissolution of sacrificial anode portion 44. As discussed herein and illustrated in FIG. 4, this may include separation of the entire electronic assembly 30 from substrate 40, with sacrificial photovoltaic cell 48, cathode portion(s) 36, device portion 32, and optional etch stop layer 52 remaining operatively attached to one another and/or remaining within electronic assembly 30.

Figure 5:
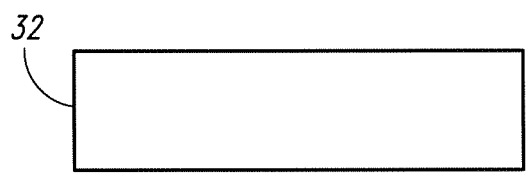
FIG. 5 provides an illustrative, non-exclusive example of a cross-sectional view of a device portion of the multilayer stack of FIG. 3 after being separated from a remainder of the multilayer stack.

Subsequently, and as illustrated in FIG. 5, device portion 32 may be separated from a remainder of the components of electronic assembly 30. As illustrative, non-exclusive examples, this separation may be accomplished by etching and/or dissolving the remainder of the components of electronic assembly 30, such as sacrificial photovoltaic cell 48, cathode portion(s) 36, and/or etch stop layer 52. It is within the scope of the present disclosure that the presence of etch stop layer 52 within electronic assembly 30 may permit removal of sacrificial photovoltaic cell 48 and/or cathode portion(s) 36 from electronic assembly 30 without damage to device portion 32. This may include etching sacrificial photovoltaic cell 48 and/or cathode portions 36 without etching device portion 32, without etching a significant amount of device portion 32, and/or without damage to device portion 32.

Figure 6:
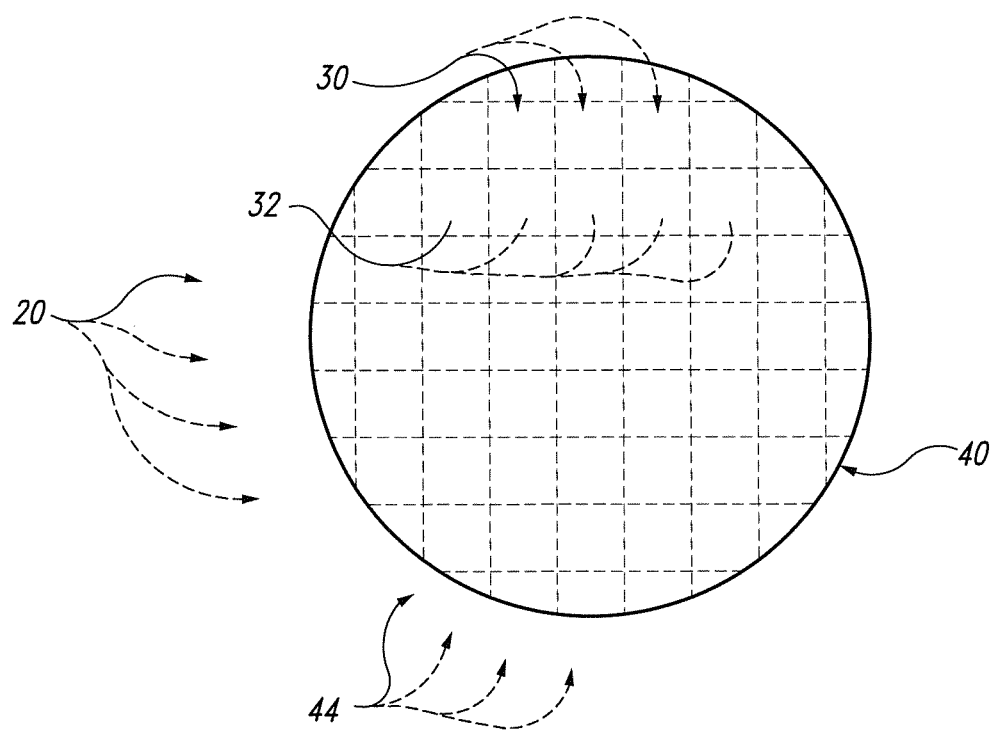
FIG. 6 provides a schematic top view of illustrative, non-exclusive examples of a substrate that includes at least one multilayer stack according to the present disclosure.

FIG. 6 provides a schematic top view of illustrative, non-exclusive examples of a substrate 40 that includes at least one multilayer stack 20 according to the present disclosure that include at least one electronic assembly 30. As illustrated in FIG. 6, substrate 40 may include and/or have formed thereon a single multilayer stack 20 that includes at least one electronic assembly 30. Alternatively, and as illustrated in dashed lines in FIG. 6, substrate 40 may include and/or have formed thereon a plurality of discrete, independent, and/or separate multilayer stacks 20, with each multilayer stack 20 including at least one electronic assembly 30.

It is within the scope of the present disclosure that each multilayer stack 20 may include a single device portion 32. However, it is also within the scope of the present disclosure that each multilayer stack 20 may include a plurality of device portions 32, such as at least 2, at least 4, at least 6, at least 8, at least 10, at least 15, or at least 20 device portions 32. Additionally or alternatively, it is also within the scope of the present disclosure that electronic assembly 30 may separate from substrate 40 (through dissolution of sacrificial anode portion 44) in any suitable manner. As an illustrative, non-exclusive example, and when substrate 40 includes a plurality of electronic assemblies 30 formed thereon, dissolution of sacrificial anode portion 44 may simultaneously singulate, or separate, the plurality of electronic assemblies 30 from one another. As another illustrative, non-exclusive example, and when substrate 40 includes the plurality of electronic assemblies 30 formed thereon, dissolution of sacrificial anode portion 44 may separate the plurality of electronic assemblies 30 from substrate 40 while retaining at least a portion of the plurality of electronic assemblies 30 in mechanical communication with, or operatively attached to, one another.

It is within the scope of the present disclosure that the various structures that are discussed herein with reference to FIGS. 1-6 may be formed from any suitable material, may be formed in any suitable manner, and/or may have any suitable geometry and/or conformation. With this in mind, the following are illustrative, non-exclusive examples of materials, fabrication processes, geometries, and/or conformations of the various structures that may be utilized with the systems and methods according to the present disclosure.

Device portion 32 may include and/or be any suitable device, electronic device, and/or optoelectronic device. As discussed, the systems and method disclosed herein may be utilized to separate device portion 32 from substrate 40, multilayer stack 20, and/or electronic assembly 30, thereby permitting use and/or utilization of device portion 32 independent from a remainder of multilayer stack 20. As an illustrative, non-exclusive example, and while not required to all embodiments, device portion 32 may include and/or be an inverted photovoltaic cell and/or an inverted metamorphic solar cell that is designed, or configured, to convert light that is incident thereupon into an electric current. However, and during formation of the inverted photovoltaic cell, a side of the inverted photovoltaic cell that is designed to receive the electromagnetic radiation may be facing toward, may define a surface normal direction that is directed toward, may be operatively attached to, and/or may be in contact with substrate 40. Thus, separation of device 32 from a remainder of multilayer stack 20 may permit operation, or efficient operation, of device 32. Additional illustrative, non-exclusive examples of device 32 include any suitable device layer, semiconductor device, III-V semiconductor device, optoelectronic device, and/or solar cell.

It is within the scope of the present disclosure that device portion 32 may be formed in any suitable manner and/or may include any suitable conformation and/or geometry. As an illustrative, non-exclusive example, device portion 32 may include, be, be formed as, and/or be formed from an epitaxial layer that is grown on substrate 40 and may be referred to herein as an epitaxial device portion 32. As additional illustrative, non-exclusive examples, device portion 32 may include and/or be a planar structure that may be continuous or discontinuous across a surface of substrate 40 (such as when substrate 40 includes a plurality of discrete device portions 32). Thus, device portion 32 also may be referred to herein as a planar device portion 32, a continuous planar device portion 32, and/or a discontinuous planar device portion 32.

Cathode portion 36 may include any suitable structure and/or material of construction. As illustrative, non-exclusive examples, cathode portion 36 may include and/or be an electrically conductive material and/or a metallic material. As additional illustrative, non-exclusive examples, cathode portion 36 also may include, be, and/or be referred to herein as a cathode layer, a cathode film, an electrically conductive cathode layer, an electrically conductive cathode film, an electroplated layer, an electroplated cathode layer, a deposited layer, a continuous cathode layer, and/or a discontinuous cathode layer. As an illustrative, non-exclusive example, and as illustrated in solid lines in FIGS. 1-4, cathode portion 36 may be discontinuous and/or may not form a continuous layer within electronic assembly 30. As another illustrative, non-exclusive example, and as illustrated in dashed lines in FIG. 1, cathode portion 36 may be a continuous layer within electronic assembly 30.

As discussed, cathode portion 36 is in electrical communication with sacrificial photovoltaic cell 48. As illustrated in FIGS. 3-4, cathode portion 36 may be in direct physical engagement, or contact, with sacrificial photovoltaic cell 48. However, it is within the scope of the present disclosure that one or more layers, materials, and/or films may separate cathode portion 36 from sacrificial photovoltaic cell 48 and may provide electrical communication therebetween.

Substrate 40 may include any suitable structure that may include multilayer stack 20, may support multilayer stack 20, and/or may have multilayer stack 20 formed thereon. As illustrative, non-exclusive examples, substrate 40 may include and/or be a semiconductor material, a semiconductor wafer, a III-V semiconductor material, Silicon, Germanium, Indium Phosphide, and/or Gallium Arsenide.

As discussed, device portion 32 may include and/or be an epitaxial device portion 32 that may be epitaxially grown on substrate 40. As such, it is within the scope of the present disclosure that sacrificial anode portion 44, sacrificial photovoltaic cell 48, and/or etch stop layer 52 also may include and/or be epitaxially grown on substrate 40, as may be needed to permit formation of device portion 32 on substrate 40 using epitaxial growth techniques.

Sacrificial anode portion 44 may include any suitable structure that may separate electronic assembly 30 from substrate 40, may operatively attach electronic assembly 30 to substrate 40, may be formed on substrate 40, and/or may function as anode 18 for electrochemical cell 10 (as illustrated in FIG. 1). As an illustrative, non-exclusive example, sacrificial anode portion 44 may be formed from a different material and/or may have a different chemical composition than that of substrate 40, sacrificial photovoltaic cell 48, cathode portion 36, etch stop layer 52, and/or device portion 32. As additional illustrative, non-exclusive examples, sacrificial anode portion 44 may include and/or be a semiconductor material, Silicon, Germanium, a III-V semiconductor material, Gallium Arsenide, Indium Gallium Arsenide, Aluminum Indium Gallium Arsenide, Arsenic Antimonide, an Antimonide, an Arsenide, and/or a Phosphide. As further illustrative, non-exclusive examples, sacrificial anode portion 44 may include, be, and/or be referred to herein as an epitaxial sacrificial anode portion, an epitaxial sacrificial anode layer, a sacrificial anode layer, a sacrificial anode film, a planar sacrificial anode layer, a continuous planar sacrificial anode layer, and/or a discontinuous planar sacrificial anode layer.

As illustrated in FIG. 3, sacrificial anode portion 44 may be in direct engagement, or contact, with substrate 40 and/or sacrificial photovoltaic cell 48. However, it is within the scope of the present disclosure that one or more intermediate layers may separate sacrificial anode portion 44 from substrate 40 and/or sacrificial photovoltaic cell 48. When an intermediate layer separates sacrificial anode portion 44 from sacrificial photovoltaic cell 48 the intermediate layer may provide electrical communication therebetween.

Sacrificial photovoltaic cell 48 may include any suitable structure that may function as internal power source 50 within multilayer stack 20 and/or may provide the potential difference that may drive, or power, electrochemical dissolution of sacrificial anode layer 44 within electrochemical cell 10 (as illustrated in FIG. 1). As an illustrative, non-exclusive example, sacrificial photovoltaic cell 48 may include and/or be an upright photovoltaic cell and/or an upright sacrificial device that is configured to provide the potential difference when electromagnetic radiation 84 is incident upon a side of sacrificial photovoltaic cell 48 that is opposed to substrate 40.

It is within the scope of the present disclosure that the potential difference that may be generated by sacrificial photovoltaic cell 48 may include any suitable magnitude. As illustrative, non-exclusive examples, the magnitude of the generated potential difference may be at least 0.1 Volts (V), at least 0.2 V, at least 0.3 V, at least 0.4 V, at least 0.5 V, at least 0.6 V, at least 0.8 V, at least 1 V, at least 1.2 V, at least 1.4 V, or at least 1.6 V. As additional illustrative, non-exclusive examples, the generated potential difference that may be less than 5 V, less than 4.75 V, less than 4.5 V, less than 4.25 V, less than 4 V, less than 3.75 V, less than 3.5 V, less than 3.25 V, less than 3 V, less than 2.75 V, less than 2.5 V, less than 2.25 V, less than 2 V, less than 1.8 V, less than 1.6 V, less than 1.4 V, less than 1.2 V, less than 1 V, less than 0.8 V, less than 0.6 V, or less than 0.4 V.

In addition, sacrificial photovoltaic cell 48 may be formed from any suitable material and/or may define any suitable conformation. As illustrative, non-exclusive examples, sacrificial photovoltaic cell 48 may include and/or be formed from a semiconductor material, Silicon, a III-V semiconductor material, Germanium, Indium Phosphide, and/or Gallium Arsenide. As additional illustrative, non-exclusive examples, sacrificial photovoltaic cell 48 may include, be, and/or be referred to herein as an epitaxial sacrificial photovoltaic cell, a planar sacrificial photovoltaic cell, a continuous planar sacrificial photovoltaic cell, and/or a discontinuous planar sacrificial photovoltaic cell.

As illustrated in FIG. 3, sacrificial photovoltaic cell 48 may be in direct engagement, or contact, with cathode portion 36 and/or with sacrificial anode portion 44. Alternatively, it is within the scope of the present disclosure that one or more intermediate layers may separate sacrificial photovoltaic cell 48 from cathode portion 36 and/or from sacrificial anode portion 44 while providing electrical communication between sacrificial photovoltaic cell 48 and cathode portion 36 and/or sacrificial anode portion 44, respectively.

External power source 70 may include any suitable structure that may generate the potential difference between cathode portion 36 and sacrificial anode portion 44. As illustrative, non-exclusive examples, external power source 70 may include and/or be a direct current (DC) power supply and/or a programmable power supply. Illustrative, non-exclusive examples of the potential difference that may be generated by external power source 70 are discussed in more detail herein with reference to sacrificial photovoltaic cell 48.

Source 80 of electromagnetic radiation 84 may include any suitable structure that may be adapted, configured, and/or designed to produce, or generate, electromagnetic radiation 84 and/or to direct electromagnetic radiation 84 onto sacrificial photovoltaic cell 48. Illustrative, non-exclusive examples of source 80 include any suitable light bulb, fluorescent light bulb, laser, light emitting diode (LED), and/or the sun. Illustrative, non-exclusive examples of electromagnetic radiation 84 include light, visible light, ultraviolet light, infrared light, fluorescent light, laser light, LED light, and/or sunlight.

Electrochemical cell 10 may include any suitable structure that may include and/or utilize multilayer stack 20 to form first half-cell 14 and second half-cell 16 (as illustrated in FIG. 1). First half-cell 14 may be defined by electrically conductive fluid 12 and cathode portion 36 and may define a first half-cell voltage, a magnitude of which may be dependent upon a composition of conductive solution 12 and a composition of cathode portion 36. Similarly, second half-cell 16 may be defined by electrically conductive fluid 12 and sacrificial anode portion 44 and may define a second half-cell voltage, a magnitude of which may be dependent upon the composition of conductive fluid 12 and a composition of sacrificial anode portion 44.

With reference to FIG. 1, and when a magnitude of the potential difference between cathode portion 36 and sacrificial anode portion 44 is greater than a difference between the first half-cell voltage and the second half-cell voltage, sacrificial anode portion 44 will dissolve within conductive fluid 12. Thus, and as discussed in more detail herein, the magnitude of the potential difference may be selected based, at least in part, on the composition of cathode portion 36, the composition of sacrificial anode portion 44, and/or the composition of electrically conductive fluid 12. Additionally or alternatively, and as also discussed herein, the composition of cathode portion 36, the composition of sacrificial anode portion 44, and/or the composition of electrically conductive fluid 12 may be selected based, at least in part, on a desired, or target, magnitude of the potential difference (and/or on a magnitude of the potential difference that may be generated by sacrificial photovoltaic cell 48, when present).

Etch stop layer 52, when present, may include any suitable material and/or structure that may function as an etch stop layer for removal of sacrificial photovoltaic cell 48 from electronic assembly 30, may be located between sacrificial photovoltaic cell 48 and device portion 32, may electrically isolate sacrificial photovoltaic cell 48 from device portion 32, and/or may electrically isolate device portion 32 from cathode portion 36. As illustrated in FIGS. 3-4, at least a portion of etch stop portion 52 may be coplanar with at least a portion, or all of, cathode portion 36. In addition, and as also illustrated in FIGS. 3-4, etch stop portion 52 may be spaced apart from cathode portion 36. However, other configurations are also within the scope of the present disclosure.

Illustrative, non-exclusive examples of etch stop layer 52 include a planar etch stop layer, a continuous planar etch stop layer, and/or a discontinuous planar etch stop layer. An additional illustrative, non-exclusive example of etch stop layer 52 includes an epitaxial etch stop layer that may be epitaxially grown and/or formed.

Electrically conductive fluid 12 may include any suitable composition that may form a portion of electrochemical cell 10, may form a portion of first half-cell 14, may form a portion of second half-cell 16, and/or may conduct an electric current, such as through conducting one or more ions, between cathode 17 and anode 18 (as illustrated in FIG. 1). As illustrative, non-exclusive examples, electrically conductive fluid 12 may include and/or be a liquid, a liquid solution, an electrolyte solution, a salt solution, and/or a dilute salt solution. As another illustrative, non-exclusive example, electrically conductive fluid 12 may include a solute dissolved in a solvent. Illustrative, non-exclusive examples of solutes that may be utilized with the systems and methods according to the present disclosure include a salt, sodium iodide, and sodium chloride. Illustrative, non-exclusive examples of solvents that may be utilized with the systems and methods according to the present disclosure include a liquid, an alcohol, isopropanol, and water. When the solvent includes water, electrically conductive fluid 12 also may be referred to herein as an aqueous solution 12 and/or as an aqueous electrically conductive fluid 12.

When electrically conductive fluid 12 includes a solute dissolved in a solvent, it is within the scope of the present disclosure that the solute may have, or define, any suitable concentration within the solvent. As illustrative, non-exclusive examples, the concentration of the solute may be at least 0.0001 molar (M), at least 0.0025 M, at least 0.005 M, at least 0.0075 M, at least 0.01 M, at least 0.02 M, at least 0.03 M, at least 0.04 M, at least 0.05 M, at least 0.06 M, at least 0.08 M, at least 0.1 M, at least 0.25 M, or at least 0.5 M. As additional illustrative, non-exclusive examples, the concentration of the solute may be less than 1 M, less than 0.75 M, less than 0.5 M, less than 0.25 M, less than 0.1 M, less than 0.075 M, less than 0.05 M, less than 0.025 M, less than 0.01 M, less than 0.009 M, less than 0.008 M, less than 0.007 M, less than 0.006 M, less than 0.005 M, less than 0.004 M, less than 0.003 M, less than 0.002 M, or less than 0.001 M.

Figure 7:
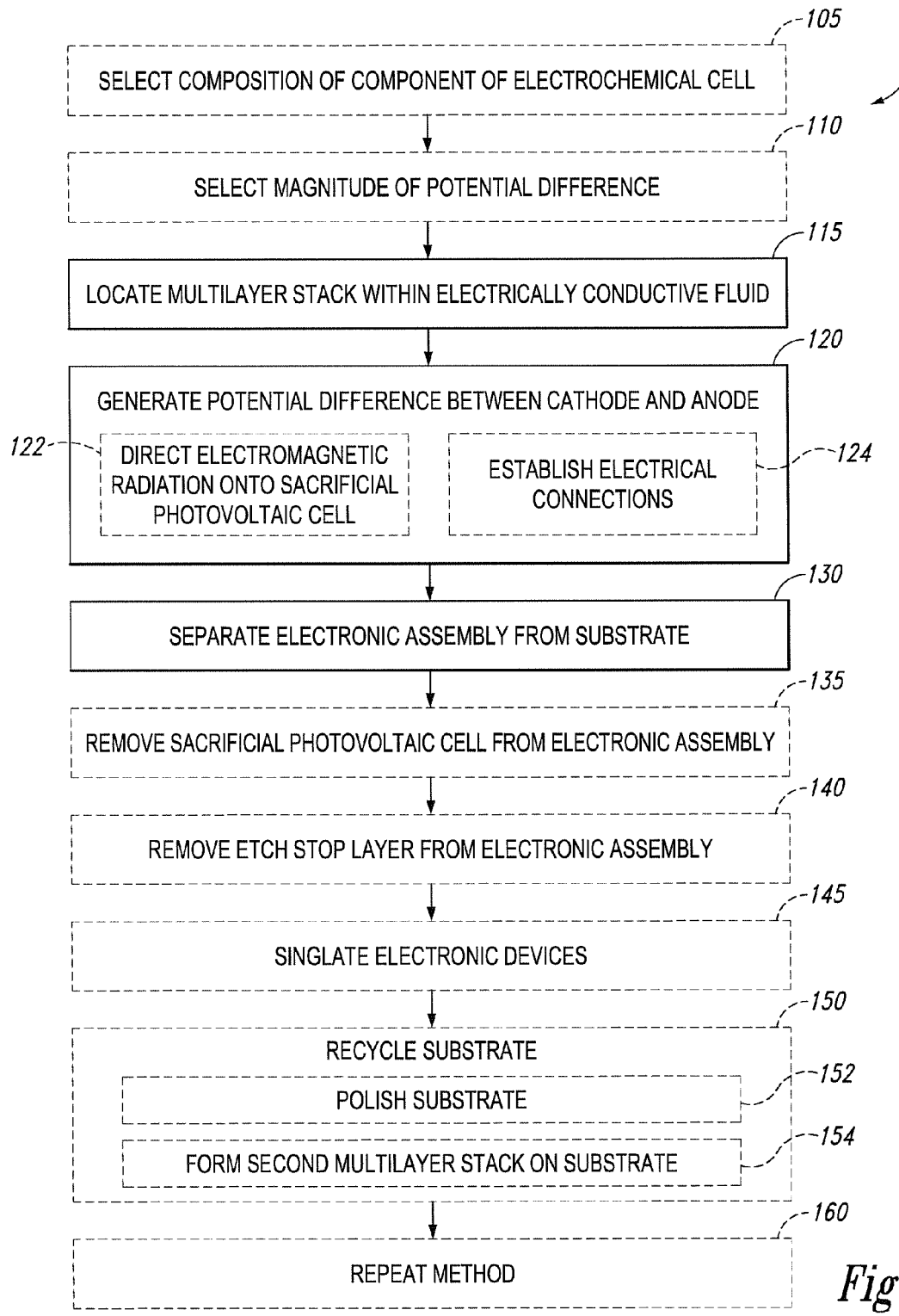
FIG. 7 is a flowchart depicting methods according to the present disclosure of separating an electronic assembly from a multilayer stack of electronic components.

FIG. 7 is a flowchart depicting methods 100 according to the present disclosure of separating an electronic assembly from a multilayer stack that includes the electronic assembly, a substrate, and a sacrificial anode portion that is located between the electronic assembly and the substrate and that operatively attaches the electronic assembly to the substrate. Methods 100 include locating the multilayer stack within an electrically conductive fluid to form an electrochemical cell at 115, generating a potential difference between a cathode portion of the electronic assembly and the sacrificial anode portion at 120, and separating the electronic assembly from the substrate at 130 by electrochemically oxidizing the sacrificial anode portion to dissolve the sacrificial anode portion within the electrically conductive fluid.

In addition, methods 100 also may include selecting a composition of one or more components of the electrochemical cell at 105, selecting a magnitude of the potential difference at 110, removing a sacrificial photovoltaic cell from the electronic assembly at 135, removing an etch stop layer from the electronic assembly at 140, singulating a plurality of electronic devices that are present on the electronic assembly at 145, recycling the substrate at 150, and/or repeating the method at 160.

Selecting the composition of one or more components of the electrochemical cell at 105 may include selecting any suitable composition based, at least in part, on any suitable criteria. As illustrative, non-exclusive examples, the selecting may include selecting a composition of the cathode portion, selecting a composition of the sacrificial anode portion, and/or selecting a composition of the electrically conductive fluid.

As discussed, the cathode portion and the electrically conductive fluid may define a first half-cell of the electrochemical cell. The first half-cell may define a first half-cell voltage, which may vary with the composition of the cathode portion and/or with the composition of the electrically conductive fluid. Similarly, the sacrificial anode portion and the electrically conductive fluid may define a second half-cell of the electrochemical cell. The second half-cell may define a second half-cell voltage, which may vary with the composition of the sacrificial anode portion and/or with the composition of the electrically conductive fluid.

As also discussed, a potential difference, or voltage, needed to electrochemically oxidize and dissolve the sacrificial anode portion within the electrically conductive fluid (at 130) may be defined based upon a difference between the first half-cell voltage and the second half-cell voltage. Thus, varying the composition at 105 may vary, change, and/or permit selection of a magnitude of the potential difference that may be needed to permit electrochemical dissolution of the sacrificial anode portion within the electrically conductive fluid.

With this in mind, the selecting at 105 may include selecting based, at least in part, on a target, or desired, magnitude of the potential difference. Additionally or alternatively, the selecting at 105 may include selecting such that the sacrificial anode portion will dissolve in the electrically conductive solution when the magnitude of the potential difference is at least a threshold magnitude. As an illustrative, non-exclusive example, and when the generating at 120 includes generating with the sacrificial photovoltaic cell, the selecting at 105 may include selecting such that the magnitude of the potential difference that is produced by the sacrificial photovoltaic cell, which also may be referred to herein as an operating voltage of the sacrificial photovoltaic cell, is greater than or equal to the target magnitude of the potential difference.

Selecting the magnitude of the potential difference at 110 may include selecting the magnitude of the potential difference based upon any suitable criteria. As an illustrative, non-exclusive example, and as discussed, the magnitude of the potential difference may be selected such that the sacrificial anode will dissolve within the electrically conductive solution during the generating at 120 and/or the separating at 130. This may include selecting the magnitude of the potential difference based upon the chemical composition of the cathode portion, the chemical composition of the anode portion, and/or the chemical composition of the electrically conductive fluid.

Locating the multilayer stack within the electrically conductive fluid to form the electrochemical cell at 115 may include fluidly contacting the cathode portion with the electrically conductive fluid and also fluidly contacting the sacrificial anode portion with the electrically conductive fluid. This may include at least partially immersing and/or submerging the multilayer stack, or at least the cathode portion and the sacrificial anode portion thereof, within the electrically conductive fluid. Regardless of the exact configuration, and subsequent to the locating at 115, the electrically conductive fluid provides electrical communication between the cathode portion and the sacrificial anode portion, thereby forming the electrochemical cell.

Generating a potential difference between a cathode portion of the electronic assembly and the sacrificial anode portion at 120 may include generating the potential difference such that the cathode portion forms, functions as, and/or is a cathode of the electrochemical cell and such that the sacrificial anode portion forms, functions as, and/or is an anode of the electrochemical cell. As an illustrative, non-exclusive example, and as discussed herein, the multilayer stack may include a sacrificial photovoltaic cell that is configured to generate the potential difference upon receipt of electromagnetic radiation. Under these conditions, the generating at 120 may include generating with the sacrificial photovoltaic cell. This may include directing the electromagnetic radiation onto, into contact with, and/or incident upon the sacrificial photovoltaic cell at 122 to generate the potential difference at 120.

As another illustrative, non-exclusive example, and as also discussed herein, the multilayer stack may be in electrical communication with an external power source that is configured to generate the potential difference. Under these conditions, the generating at 120 may include generating with the external power source, and methods 100 may include, at 124, establishing a first electrical connection between the cathode portion and a positive terminal of the external power source and/or establishing a second electrical connection between the sacrificial anode portion and the negative terminal of the external power source.

Regardless of the exact mechanism that may be utilized during the generating at 120, the generating may include generating a potential difference (or voltage) that is of sufficient magnitude to electrochemically oxidize the sacrificial anode portion and thereby dissolve the sacrificial anode portion within the electrically conductive fluid. Illustrative, non-exclusive examples of magnitudes (voltages) of the potential difference are discussed herein.

Additionally or alternatively, and as discussed, the generated potential difference may be greater than the difference between the first half-cell voltage and the second half-cell voltage. As illustrative, non-exclusive examples, the generated potential difference may be at least 105%, at least 110%, at least 115%, at least 120%, at least 130%, at least 140%, at least 150%, at least 160%, at least 170%, at least 180%, at least 190%, or at least 200% of the difference between the first half-cell voltage and the second half-cell voltage.

Separating the electronic assembly from the substrate at 130 may include electrochemically oxidizing the sacrificial anode portion to dissolve the sacrificial anode portion within the electrically conductive fluid. As discussed, and prior to the separating at 130, the sacrificial anode portion operatively attaches the electronic assembly to the substrate. Thus, and as also discussed, dissolution of the sacrificial anode portion within the electrically conductive fluid removes this operational attachment, thereby permitting separation of the electronic assembly from the substrate.

It is within the scope of the present disclosure that the separating at 130 may include separating without etching the sacrificial anode portion, without chemically etching the sacrificial anode portion, and/or without significant etching of the sacrificial anode portion. Thus, the systems and methods disclosed herein may permit separation of the electronic assembly from the substrate without the inclusion of a corrosive material, such as an acid, a strong acid, a base, a strong base, hydrofluoric acid, succinic acid, ammonium hydroxide, and/or hydrogen peroxide within the electrically conductive fluid during the separating at 130.

Additionally or alternatively, the systems and methods disclosed herein may permit separation of the electronic assembly from the substrate without mechanically peeling the electronic assembly from the substrate. However, it is within the scope of the present disclosure that the electrically conductive fluid further may include one or more corrosive materials and/or that the methods further may include mechanically peeling, either of which may increase a rate of the separating at 130.

When the electronic assembly includes the sacrificial photovoltaic cell, and as discussed, the separating at 130 may include separating the sacrificial photovoltaic cell from the substrate and/or maintaining operative attachment between the sacrificial photovoltaic cell and a remainder of the electronic assembly during the separating at 130. Under these conditions, methods 100 further may include removing the sacrificial photovoltaic cell from the electronic assembly at 135. Removing the sacrificial photovoltaic cell from the electronic assembly at 135 may include removing the sacrificial photovoltaic cell in any suitable manner. As illustrative, non-exclusive examples, the removing at 135 may include dissolving the sacrificial photovoltaic cell and/or etching the sacrificial photovoltaic cell to remove the sacrificial photovoltaic cell from the electronic assembly.

As discussed herein, the electronic assembly further may include an etch stop layer. As an illustrative, non-exclusive example, the etch stop layer may be located between the sacrificial photovoltaic cell and a device portion of the electronic assembly, such as to permit the removing at 135 without damaging the device portion. Under these conditions, it further may be desirable to remove the etch stop layer from the device portion and/or to separate the etch stop layer from a remainder of the electronic assembly. Thus, methods 100 further may include removing the etch stop layer from the electronic assembly at 140. The removing at 140 may be accomplished in any suitable manner, including dissolution of the etch stop layer and/or etching of the etch stop layer.

As discussed herein, the device portion may include a plurality of electronic devices. Under these conditions, it may be desirable to separate at least a portion of the plurality of electronic devices from a remainder of the plurality of electronic devices. Thus, methods 100 further may include singulating the plurality of electronic devices that are present on the electronic assembly at 145.

It is within the scope of the present disclosure that the singulating at 145 may be performed concurrently with the separating at 130 or subsequent to the separating at 130. As an illustrative, non-exclusive example, the sacrificial anode portion may operatively attach the plurality of electronic devices to the substrate and the device portion may not include another structure that operatively attaches the plurality of electronic devices to one another. Under these conditions, the separating at 130 also may accomplish the singulating at 145 (thus, the singulating at 145 may be performed concurrently with the separating at 130). As another illustrative, non-exclusive example, the device portion may include one or more additional structures that may operatively attach the plurality of electronic devices to one another. Under these conditions, the singulating at 145 may be a separate step that is performed subsequent to the separating at 130.

Recycling the substrate at 150 may include recycling the substrate in any suitable manner and may be performed subsequent to the separating at 130. As an illustrative, non-exclusive example, the recycling at 150 may include polishing the substrate at 152, such as to decrease a surface roughness of the substrate. As another illustrative, non-exclusive example, the multilayer stack may be a first multilayer stack and the recycling at 150 may include forming a second multilayer stack on the substrate at 154.

The second multilayer stack may include a second electronic assembly, the substrate, and a second sacrificial anode portion and may be at least substantially similar to the first multilayer stack. Additionally or alternatively, the second multilayer stack may be different from the first multilayer stack.

When methods 100 include the forming the second multilayer stack at 154, methods 100 further may include repeating the methods at 160. Repeating the methods at 160 may include repeating any suitable portion of methods 100. As an illustrative, non-exclusive example, the repeating at 160 may include repeating at least the locating at 115, the generating at 120, and the separating at 130 to separate the second electronic assembly from the substrate. This process may be repeated any suitable number of times to form any suitable number of electronic assemblies on the substrate and to subsequently remove the electronic assemblies from the substrate. As illustrative, non-exclusive examples, the repeating at 160 may include repeating at least 3, at least 4, at least 5, at least 6, at least 8, at least 10, at least 15, or at least 20 times.

Illustrative, non-exclusive examples of inventive subject matter according to the present disclosure are described in the following enumerated paragraphs:

A1. A method of separating an electronic assembly from a multilayer stack of electronic components that includes the electronic assembly, a substrate, and a sacrificial anode portion that is located between the electronic assembly and the substrate and that operatively attaches the electronic assembly to the substrate, wherein the electronic assembly includes a cathode portion and a device portion, the method comprising:

locating the multilayer stack within an electrically conductive fluid to form an electrochemical cell;

generating a potential difference between the cathode portion and the sacrificial anode portion such that the cathode portion forms a cathode of the electrochemical cell and the sacrificial anode portion forms an anode of the electrochemical cell; and separating the electronic assembly from the substrate by electrochemically oxidizing the sacrificial anode portion to dissolve the sacrificial anode portion within the electrically conductive fluid.

A2. The method of paragraph A1, wherein the electronic assembly further includes a sacrificial photovoltaic cell that is located between and in electrical and mechanical communication with the cathode portion and the sacrificial anode portion, and further wherein the generating includes generating the potential difference with the sacrificial photovoltaic cell.

A3. The method of paragraph A2, further comprising:

directing electromagnetic radiation onto the sacrificial photovoltaic cell to initiate the generating.

A4. The method of paragraph A3, wherein the electromagnetic radiation includes at least one of light, visible light, infrared light, ultraviolet light, fluorescent light, laser light, LED light, and sunlight.

A5. The method of any of paragraphs A2-A4, wherein, prior to the separating, the sacrificial anode portion is located between and operatively attaches the sacrificial photovoltaic cell to the substrate, and further wherein the separating includes separating the sacrificial photovoltaic cell from the substrate while maintaining mechanical communication between the sacrificial photovoltaic cell and the device portion.

A6. The method of paragraph A5, further comprising:
removing the sacrificial photovoltaic cell from the electronic assembly.

A7. The method of paragraph A6, wherein the removing the sacrificial photovoltaic cell includes at least one of dissolving the sacrificial photovoltaic cell and etching the sacrificial photovoltaic cell.

A8. The method of any of paragraphs A6-A7, wherein the electronic assembly further includes an etch stop portion that is located between the device portion and the sacrificial photovoltaic cell, and wherein the method further comprises:
removing the etch stop layer from the device portion.

A9. The method of paragraph A8, wherein the removing the etch stop layer includes at least one of dissolving the etch stop portion and etching the etch stop portion.

A10. The method of any of paragraphs A1-A9, further comprising:
establishing a first electrical connection between the cathode portion and a positive terminal of an external power source; and
establishing a second electrical connection between the sacrificial anode portion and a negative terminal of the external power source, wherein the generating includes generating the potential difference with the external power source.

A11. The method of paragraph A10, wherein the external power source includes a direct current external power source.

A12. The method of any of paragraphs A1-A11, wherein the multilayer stack is a first multilayer stack, wherein the electronic assembly is a first electronic assembly of the first multilayer stack, wherein the sacrificial anode portion is a first sacrificial anode portion of the first multilayer stack, and further wherein, subsequent to the separating, the method further comprises:
forming a second multilayer stack that includes a second electronic assembly, the substrate, and a second sacrificial anode portion that is located between the second electronic assembly and the substrate and that operatively attaches the second electronic assembly to the substrate.

A13. The method of paragraph A12, wherein, prior to the forming a second multilayer stack and subsequent to the separating the electronic assembly from the substrate, the method further comprises:
polishing the substrate.

A14. The method of any of paragraphs A12-A13, wherein the method further comprises:
repeating at least the locating, the generating, and the separating to separate the second electronic assembly from the substrate.

A15. The method of paragraph A14, wherein the method further comprises:
repeating the method a plurality of times to separate a plurality of electronic assemblies from the substrate, optionally wherein the repeating includes repeating at least 3, at least 4, at least 5, at least 6, at least 8, at least 10, at least 15, or at least 20 times to separate a respective number of device portions from the substrate.

A16. The method of any of paragraphs A1-A15, further comprising:
selecting a chemical composition of at least one, optionally at least two, optionally all, of the cathode portion, the anode portion, and the electrically conductive fluid.

A17. The method of paragraphs A16, wherein the selecting the chemical composition is based, at least in part, on a desired magnitude of the potential difference.

A18. The method of paragraph A17, wherein the selecting the chemical composition includes selecting such that the sacrificial anode portion will dissolve within the electrically conductive fluid when a magnitude of the potential difference is at least the desired magnitude.

A19. The method of any of paragraphs A17-A18, wherein the multilayer stack includes a/the sacrificial photovoltaic cell that is in electrical communication with the cathode portion and the sacrificial anode portion, wherein the sacrificial photovoltaic cell defines an operating voltage, and further wherein the desired magnitude of the potential difference is based on, or equal to, the operating voltage of the sacrificial photovoltaic cell.

A20. The method of any of paragraphs A1-A19, further comprising:
selecting a magnitude of the potential difference.

A21. The method of paragraph A20, wherein the selecting the magnitude is based, at least in part, on a/the chemical composition of at least one, optionally at least two, optionally all, of the cathode portion, the anode portion, and the electrically conductive fluid.

A22. The method of any of paragraphs A1-A21, further comprising:
separating the electronic assembly from the substrate without etching the sacrificial anode portion.

A23. The method of any of paragraphs A1-A22, wherein the electrically conductive fluid does not include at least one, and optionally any, of an acid, a strong acid, a base, a strong base, a corrosive material, hydrofluoric acid, succinic acid, ammonium hydroxide, and hydrogen peroxide.

A24. The method of any of paragraphs A1-A23, further comprising:
separating the electronic assembly from the substrate without mechanically peeling the electronic assembly from the substrate.

A25. The method of any of paragraphs A1-A24, wherein the sacrificial anode portion includes at least one of a semiconductor material, Silicon, Germanium, a III-V semiconductor material, Gallium Arsenide, Indium Gallium Arsenide, Aluminum Indium Gallium Arsenide, Arsenic Antimonide, an Antimonide, an Arsenide, and a Phosphide.

A26. The method of any of paragraphs A1-A25, wherein the substrate includes at least one of a semiconductor material, Silicon, a III-V semiconductor material, Germanium, Indium Phosphide, and Gallium Arsenide.

A27. The method of any of paragraphs A1-A26, wherein the generating a potential difference includes generating a potential difference that is at least one of:
(i) at least 0.1 Volts (V), at least 0.2 V, at least 0.3 V, at least 0.4 V, at least 0.5 V, at least 0.6 V, at least 0.8 V, at least 1 V, at least 1.2 V, at least 1.4 V, or at least 1.6 V; and
(ii) less than 5 V, less than 4.75 V, less than 4.5 V, less than 4.25 V, less than 4 V, less than 3.75 V, less than 3.5 V, less than 3.25 V, less than 3 V, less than 2.75 V, less than 2.5 V, less than 2.25 V, less than 2 V, less than 1.8 V, less than 1.6 V, less than 1.4 V, less than 1.2 V, less than 1 V, less than 0.8 V, less than 0.6 V, or less than 0.4 V.

A28. The method of any of paragraphs A1-A27, wherein the cathode portion and the electrically conductive fluid define a first half-cell that defines a first half-cell voltage, wherein the sacrificial anode portion and the electrically conductive fluid define a second half-cell that defines a second half-cell voltage, and further wherein the generating a potential difference includes generating a potential difference that is greater than a difference between the first half-cell voltage and the second half-cell voltage.

A29. The method of paragraph A28, wherein the generating a potential difference includes generating a potential difference that is at least 105%, at least 110%, at least 115%, at least 120%, at least 130%, at least 140%, at least 150%, at least 160%, at least 170%, at least 180%, at least 190%, or at least 200% of the difference between the first half-cell voltage and the second half-cell voltage.

A30. The method of any of paragraphs A1-A29, wherein the cathode portion includes at least one of an electrically conductive material and a metallic material.

A31. The method of any of paragraphs A1-A30, wherein the device portion includes at least one of a device layer, a semiconductor device, an optoelectronic device, a III-V semiconductor device, a photovoltaic cell, an inverted photovoltaic cell, and an inverted metamorphic solar cell.

A32. The method of any of paragraphs A1-A31, wherein the cathode portion includes at least one of a cathode layer, a cathode film, an electrically conductive cathode layer, an electrically conductive cathode film, an electroplated cathode layer, a deposited layer, a continuous cathode layer, and a discontinuous cathode layer.

A33. The method of any of paragraphs A1-A32, wherein the sacrificial anode portion includes at least one of a sacrificial anode layer, a sacrificial anode film, an epitaxially grown sacrificial anode layer, a continuous sacrificial anode layer, and a discontinuous sacrificial anode layer.

A34. The method of any of paragraphs A1-A33, wherein the device portion includes a plurality of electronic devices, and the method further comprising:
singulating the plurality of electronic devices.

A35. The method of paragraph A34, wherein the singulating includes at least one of singulating concurrently with the separating and singulating subsequent to the separating.

A36. The method of any of paragraphs A34-A35, wherein the plurality of electronic devices includes at least one of a plurality of optoelectronic devices, a plurality of photovoltaic cells, a plurality of inverted photovoltaic cells, and a plurality of inverted metamorphic solar cells.

A37. The method of any of paragraphs A1-A36, wherein the electrically conductive fluid includes at least one of an electrolyte solution, a salt solution, and a dilute salt solution.

A38. The method of any of paragraphs A1-A37, wherein the electrically conductive fluid includes a solute dissolved in a solvent.

A39. The method of paragraph A38, wherein a concentration of the solute is at least one of:
(i) at least 0.0001 molar (M), at least 0.0025 M, at least 0.005 M, at least 0.0075 M, at least 0.01 M, at least 0.02 M, at least 0.03 M, at least 0.04 M, at least 0.05 M, at least 0.06 M, at least 0.08 M, at least 0.1 M, at least 0.25 M, or at least 0.5 M; and
(ii) less than 1 M, less than 0.75 M, less than 0.5 M, less than 0.25 M, less than 0.1 M, less than 0.075 M, less than 0.05 M, less than 0.025 M, less than 0.01 M, less than 0.009 M, less than 0.008 M, less than 0.007 M, less than 0.006 M, less than 0.005 M, less than 0.004 M, less than 0.003 M, less than 0.002 M, or less than 0.001 M.

A40. The method of any of paragraphs A38-A39, wherein the solute includes at least one of a salt, sodium iodide, and sodium chloride.

A41. The method of any of paragraphs A38-A40, wherein the solvent includes water.

B1. A multilayer stack of electronic materials, comprising:
a substrate;
a sacrificial anode portion; and
an electronic assembly, wherein the sacrificial anode portion is located between the electronic assembly and the substrate and operatively attaches the electronic assembly to the substrate, and further wherein the electronic assembly includes:
a sacrificial photovoltaic cell that is in electrical communication with the sacrificial anode portion;
a cathode portion that is in electrical communication with the sacrificial photovoltaic cell, wherein the sacrificial photovoltaic cell electrically separates the cathode portion from the sacrificial anode portion; and
a device portion, wherein the sacrificial photovoltaic cell is located between the substrate and the device portion.

B2. The multilayer stack of paragraph B1, further comprising:
an etch stop portion that is located between the sacrificial photovoltaic cell and the device portion and operatively attaches the sacrificial photovoltaic cell to the device portion.

B3. The multilayer stack of paragraph B2, wherein the etch stop portion is in direct engagement with the sacrificial photovoltaic cell and the device portion.

B4. The multilayer stack of any of paragraphs B2-B3, wherein the etch stop portion includes an epitaxial etch stop layer.

B5. The multilayer stack of any of paragraphs B2-B4, wherein the etch stop portion includes a planar etch stop layer, optionally a continuous planar etch stop layer, and further optionally a discontinuous planar etch stop layer.

B6. The multilayer stack of any of paragraphs B2-B5, wherein at least a portion of the etch stop portion is coplanar with at least a portion of the cathode portion, and optionally the entire cathode portion.

B7. The multilayer stack of any of paragraphs B1-B6, wherein the substrate includes at least one of a semiconductor material, a semiconductor wafer, Silicon, Germanium, a III-V semiconductor material, Indium Phosphide, and Gallium Arsenide.

B8. The multilayer stack of any of paragraphs B1-B7, wherein the sacrificial anode portion includes at least one of a semiconductor material, Silicon, Germanium, a III-V semiconductor material, Gallium Arsenide, Indium Gallium Arsenide, Aluminum Indium Gallium Arsenide, Arsenic Antimonide, an Antimonide, an Arsenide, and a Phosphide.

B9. The multilayer stack of any of paragraphs B1-B8, wherein the sacrificial anode portion is an epitaxial sacrificial anode portion.

B10. The multilayer stack of any of paragraphs B1-B9, wherein the sacrificial anode portion is in direct engagement with the substrate and the sacrificial photovoltaic cell.

B11. The multilayer stack of any of paragraphs B1-B10, wherein the sacrificial anode portion is an epitaxial sacrificial anode layer.

B12. The multilayer stack of any of paragraphs B1-B10, wherein the sacrificial anode portion includes a planar sacrificial anode layer, optionally a continuous planar sacrificial anode layer, and further optionally a discontinuous planar sacrificial anode layer.

B13. The multilayer stack of any of paragraphs B1-B12, wherein the sacrificial photovoltaic cell includes an upright sacrificial device.

B14. The multilayer stack of any of paragraphs B1-B13, wherein the sacrificial photovoltaic cell is configured to receive electromagnetic radiation and to generate a potential difference between the sacrificial anode portion and the cathode portion responsive to receipt of the electromagnetic radiation.

B15. The multilayer stack of paragraph B14, wherein the potential difference includes a potential difference that is at least one of:
(i) at least 0.1 Volts (V), at least 0.2 V, at least 0.3 V, at least 0.4 V, at least 0.5 V, at least 0.6 V, at least 0.8 V, at least 1 V, at least 1.2 V, at least 1.4 V, or at least 1.6 V; and
(ii) less than 5 V, less than 4.75 V, less than 4.5 V, less than 4.25 V, less than 4 V, less than 3.75 V, less than 3.5 V, less than 3.25 V, less than 3 V, less than 2.75 V, less than 2.5 V, less than 2.25 V, less than 2 V, less than 1.8 V, less than 1.6 V, less than 1.4 V, less than 1.2 V, less than 1 V, less than 0.8 V, less than 0.6 V, or less than 0.4 V.

B16. The multilayer stack of any of paragraphs B1-1315, wherein the sacrificial photovoltaic cell includes an epitaxial sacrificial photovoltaic cell.

B17. The multilayer stack of any of paragraphs B1-B16, wherein the sacrificial photovoltaic cell includes a planar sacrificial photovoltaic cell, optionally a continuous planar sacrificial photovoltaic cell, and further optionally a discontinuous planar sacrificial photovoltaic cell.

B18. The multilayer stack of any of paragraphs B1-B17, wherein the sacrificial photovoltaic cell is in direct engagement with the cathode portion and the sacrificial anode portion.

B19. The multilayer stack of any of paragraphs B1-B18, wherein the sacrificial photovoltaic cell is formed from at least one of a semiconductor material, Silicon, Germanium, a III-V semiconductor material, Indium Phosphide, Gallium, Arsenic, and Gallium Arsenide.

B20. The multilayer stack of any of paragraphs B1-B19, wherein the cathode portion includes at least one of an electrically conductive material and a metallic material.

B21. The multilayer stack of any of paragraphs B1-B20, wherein the cathode portion includes at least one of a cathode layer, a cathode film, an electrically conductive cathode layer, an electrically conductive cathode film, an electroplated cathode layer, a deposited layer, a continuous cathode layer, and a discontinuous cathode layer.

B22. The multilayer stack of any of paragraphs B1-B21, wherein the cathode portion is in direct engagement with the sacrificial photovoltaic cell.

B23. The multilayer stack of any of paragraphs B1-B22, wherein the device portion is an epitaxial device portion.

B24. The multilayer stack of any of paragraphs B1-B23, wherein the device portion includes at least one of a device layer, a semiconductor device, a III-V semiconductor device, a photovoltaic cell, an inverted photovoltaic cell, and an inverted metamorphic solar cell.

B25. The multilayer stack of any of paragraphs B1-B24, wherein the device portion includes a plurality of electronic devices.

B26. The multilayer stack of paragraph B25, wherein the plurality of electronic devices includes at least one of a plurality of photovoltaic cells, a plurality of inverted photovoltaic cells, and a plurality of inverted metamorphic solar cells.

B27. The multilayer stack of any of paragraphs B1-B26, wherein the device portion includes a planar device portion, optionally a continuous planar device portion, and further optionally a discontinuous planar device portion.

C1. An electrochemical cell, comprising:
an electrically conductive fluid; and
the multilayer stack of any of paragraphs B1-B27, wherein the multilayer stack is located within the electrically conductive fluid.

C2. The electrochemical cell of paragraph C1, wherein the electrically conductive fluid includes at least one of a liquid solution, an electrolyte solution, a salt solution, and a dilute salt solution.

C3. The electrochemical cell of any of paragraphs C1-C2, wherein the electrically conductive fluid includes a solute dissolved in a solvent.

C4. The electrochemical cell of paragraph C3, wherein a concentration of the solute is at least one of:
(i) at least 0.0001 molar (M), at least 0.0025 M, at least 0.005 M, at least 0.0075 M, at least 0.01 M, at least 0.02 M, at least 0.03 M, at least 0.04 M, at least 0.05 M, at least 0.06 M, at least 0.08 M, at least 0.1 M, at least 0.25 M, or at least 0.5 M; and
(ii) less than 1 M, less than 0.75 M, less than 0.5 M, less than 0.25 M, less than 0.1 M, less than 0.075 M, less than 0.05 M, less than 0.025 M, less than 0.01 M, less than 0.009 M, less than 0.008 M, less than 0.007 M, less than 0.006 M, less than 0.005 M, less than 0.004 M, less than 0.003 M, less than 0.002 M, or less than 0.001 M.

C5. The electrochemical cell of any of paragraphs C3-C4, wherein the solute includes at least one of a salt, sodium iodide, and sodium chloride.

C6. The electrochemical cell of any of paragraphs C3-C5, wherein the solvent includes at least one of a liquid and water.

C7. The electrochemical cell of any of paragraphs C1-C6 in combination with a source of electromagnetic radiation, wherein the source of electromagnetic radiation is oriented to direct the electromagnetic radiation onto the sacrificial photovoltaic cell, wherein at least one of a wavelength of the electromagnetic radiation and an intensity of the electromagnetic radiation is selected such that the sacrificial photovoltaic cell generates a potential difference between the cathode portion and the sacrificial anode portion, wherein the potential difference produces dissolution of the sacrificial anode portion within the electrically conductive fluid, and further wherein a portion of the sacrificial anode portion is dissolved within the electrically conductive fluid.

As used herein, the terms "selective" and "selectively," when modifying an action, movement, configuration, or other activity of one or more components or characteristics of an apparatus, mean that the specific action, movement, configuration, or other activity is a direct or indirect result of user manipulation of an aspect of, or one or more components of, the apparatus.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

The various disclosed elements of apparatuses and steps of methods disclosed herein are not required to all apparatuses and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus or method. Accordingly, such inventive subject matter is not required to be associated with the specific apparatuses and methods that are expressly disclosed herein, and such inventive subject matter may find utility in apparatuses and/or methods that are not expressly disclosed herein.

The invention claimed is:

1. A multilayer stack of electronic materials, comprising:
a substrate;
an electronic assembly, wherein the electronic assembly includes a sacrificial photovoltaic cell; and
a sacrificial anode portion, wherein the sacrificial anode portion is located between the electronic assembly and the substrate and operatively attaches the electronic assembly to the substrate, wherein the sacrificial anode portion is configured to be dissolved via electrochemical oxidation to permit separation of the electronic assembly from the substrate, and further wherein the sacrificial photovoltaic cell is in electrical communication with the sacrificial anode portion and is configured to apply an electric potential to the sacrificial anode portion to power dissolution of the sacrificial anode portion.

2. The multilayer stack of claim 1, wherein the electronic assembly further includes a cathode portion that is in electrical communication with the sacrificial photovoltaic cell, wherein the sacrificial photovoltaic cell is configured to generate a potential difference between the cathode portion and the sacrificial anode portion to power the dissolution of the sacrificial anode portion.

3. The multilayer stack of claim 2, wherein the sacrificial photovoltaic cell is configured to receive electromagnetic radiation and to generate the potential difference between the cathode portion and the sacrificial anode portion responsive to receipt of the electromagnetic radiation, and further wherein a magnitude of the potential difference between the cathode portion and the sacrificial anode portion is at least 0.1 Volts (V) and less than 5 V.

4. The multilayer stack of claim 1, wherein the electronic assembly includes a device portion that includes at least one of a device layer, a semiconductor device, a III-V semiconductor device, a photovoltaic cell, an inverted photovoltaic cell, and an inverted metamorphic solar cell.

5. The multilayer stack of claim 4, wherein the electronic assembly further includes a sacrificial photovoltaic cell, wherein the sacrificial photovoltaic cell is located between the substrate and the device portion.

6. The multilayer stack of claim 5, wherein the electronic assembly further includes an etch stop portion that is located between the sacrificial photovoltaic cell and the device portion and that operatively attaches the sacrificial photovoltaic cell to the device portion.

7. The multilayer stack of claim 1, wherein the sacrificial anode portion is an epitaxially grown sacrificial anode portion.

8. The multilayer stack of claim 1, wherein the electronic assembly further includes a cathode portion, wherein the sacrificial anode portion is configured to dissolve responsive to a potential difference between the sacrificial anode portion and the cathode portion being greater than a threshold potential difference.

9. An electrochemical cell, comprising:
an electrically conductive fluid; and
the multilayer stack of claim 8, wherein the multilayer stack is located within the electrically conductive fluid.

10. The electrochemical cell of claim 9, wherein a fraction of the sacrificial anode portion is electrochemically oxidized and dissolved within the electrically conductive fluid.

11. The electrochemical cell of claim 9 in combination with a power source that is in electrical communication with the cathode portion and with the sacrificial anode portion and is configured to generate the potential difference between the cathode portion and the sacrificial anode portion.

12. The electrochemical cell of claim 11, wherein the power source is an internal power source that forms a portion of the multilayer stack.

13. The electrochemical cell of claim 11, wherein the power source is an external power source that is external to the multilayer stack.

14. A method of separating an electronic assembly from a multilayer stack of electronic components that includes the electronic assembly, a substrate, a cathode portion, and a sacrificial anode portion that is located between the electronic assembly and the substrate and that operatively attaches the electronic assembly to the substrate, the method comprising:
locating the multilayer stack within an electrically conductive fluid to form an electrochemical cell;
generating a potential difference between the cathode portion and the sacrificial anode portion; and
separating the electronic assembly from the substrate by electrochemically oxidizing the sacrificial anode portion to dissolve the sacrificial anode portion within the electrically conductive fluid.

15. The method of claim 14, wherein the electronic assembly further includes a sacrificial photovoltaic cell that is located between and in electrical and mechanical communication with the cathode portion and the sacrificial anode portion, and further wherein the generating includes:
generating the potential difference with the sacrificial photovoltaic cell.

16. The method of claim 15, further comprising:
directing electromagnetic radiation onto the sacrificial photovoltaic cell to initiate the generating.

17. The method of claim 14, further comprising:
establishing a first electrical connection between the cathode portion and a positive terminal of an external power source; and
establishing a second electrical connection between the sacrificial anode portion and a negative terminal of the external power source, wherein the generating includes generating the potential difference between the cathode portion and the sacrificial anode portion with the external power source.

18. The method of claim 14, further comprising at least one of:
(i) separating the electronic assembly from the substrate without etching the sacrificial anode portion; and
(ii) separating the electronic assembly from the substrate without mechanically peeling the electronic assembly from the substrate.

19. The method of claim 14, wherein the electronic assembly includes a plurality of electronic devices and the method further comprises:
singulating the plurality of electronic devices concurrently with the separating.

20. A multilayer stack of electronic materials, comprising:
a substrate;
an electronic assembly, wherein the electronic assembly includes:
(i) a device portion that includes at least one of a device layer, a semiconductor device, a III-V semiconductor device, a photovoltaic cell, an inverted photovoltaic cell, and an inverted metamorphic solar cell; and
(ii) a sacrificial photovoltaic cell, wherein the sacrificial photovoltaic cell is located between the substrate and the device portion; and
a sacrificial anode portion, wherein the sacrificial anode portion is located between the electronic assembly and the substrate and operatively attaches the electronic assembly to the substrate, and further wherein the sacrificial anode portion is configured to be dissolved via electrochemical oxidation to permit separation of the electronic assembly from the substrate.

21. A multilayer stack of electronic materials, comprising:
a substrate;
an electronic assembly; and
a sacrificial anode portion, wherein the sacrificial anode portion is located between the electronic assembly and the substrate and operatively attaches the electronic assembly to the substrate, wherein the sacrificial anode portion is configured to be dissolved via electrochemical oxidation to permit separation of the electronic assembly from the substrate, and further wherein the sacrificial anode portion is an epitaxially grown sacrificial anode portion.

22. A multilayer stack of electronic materials, comprising:
a substrate;
an electronic assembly;
a sacrificial anode portion, wherein the sacrificial anode portion is located between the electronic assembly and the substrate and operatively attaches the electronic assembly to the substrate, and further wherein the sacrificial anode portion is configured to be dissolved via electrochemical oxidation to permit separation of the electronic assembly from the substrate; and
a cathode portion, wherein the sacrificial anode portion is configured to dissolve responsive to a potential difference between the sacrificial anode portion and the cathode portion being greater than a threshold potential difference.

* * * * *